(12) United States Patent
Law et al.

(10) Patent No.: US 12,094,551 B2
(45) Date of Patent: Sep. 17, 2024

(54) MODULAR ERROR CORRECTION CODE CIRCUITRY

(71) Applicant: Intel Corporation, Santa Clara, CA (US)

(72) Inventors: Hwa Chaw Law, Kuala Langat (MY); Yu Ying Ong, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 17/133,810

(22) Filed: Dec. 24, 2020

(65) Prior Publication Data

US 2021/0151120 A1    May 20, 2021

(51) Int. Cl.
| | | |
|---|---|---|
| *G11C 29/42* | (2006.01) | |
| *G11C 29/00* | (2006.01) | |
| *G11C 29/12* | (2006.01) | |
| *G11C 29/44* | (2006.01) | |

(52) U.S. Cl.
CPC .......... *G11C 29/42* (2013.01); *G11C 29/1201* (2013.01); *G11C 29/44* (2013.01); *G11C 29/78* (2013.01)

(58) Field of Classification Search
CPC ..... G11C 29/42; G11C 29/1201; G11C 29/44; G11C 29/78; G11C 29/702; G11C 2029/0411; H03M 13/611; H03M 13/616; H03M 13/6502; H03M 13/09; H03M 13/13; H03M 13/19; G06F 11/1012; G06F 11/1048
See application file for complete search history.

(56) References Cited

U.S. PATENT DOCUMENTS

| | | | | |
|---|---|---|---|---|
| 11,467,760 | B1* | 10/2022 | Avron | ...................... G06F 11/10 |
| 2015/0278004 | A1* | 10/2015 | Li | ........................ G06F 11/1048 714/6.11 |
| 2019/0188078 | A1* | 6/2019 | Yu | ....................... H03M 13/1154 |
| 2020/0264950 | A1* | 8/2020 | Schaefer | ............. G06F 11/1048 |
| 2022/0121516 | A1* | 4/2022 | Walker | ................ G06F 9/30098 |

OTHER PUBLICATIONS

Block Matrix; https://en.wikipedia.org/wiki/Block_matrix; accessed Mar. 24, 2021.
Hamming Code; https://en.wikipedia.org/wiki/Hamming_code; accessed Mar. 24, 2021.

* cited by examiner

*Primary Examiner* — Xiaochun L Chen
(74) *Attorney, Agent, or Firm* — Fletcher Yoder, P.C.

(57) ABSTRACT

A modular Error Correction Code (ECC) scheme in a multi-channel IO link of an integrated circuit device is provided. The integrated circuit device may include core logic circuitry that may be configured after manufacturing. To accommodate the resulting variation, the modular ECC scheme may allow for partitioning a parity check matrix associated with the configuration of the core logic and peripheries coupled to the core logic. The parity check matrix is partitioned into smaller block matrices that is programmable. Multiple ECC modules corresponding to the block matrices are used to provide error detection and correction in the multi-channel IO link. The modular ECC scheme combined with programmable matrices (configurability) enables multi-channel IO link to be flexible to form different IO topologies.

20 Claims, 7 Drawing Sheets

MODULAR ERROR CORRECTION CODE CIRCUITRY

BACKGROUND

The present disclosure relates generally to error handling in an interconnect of an integrated circuit device using modular Error Correction Code (ECC) circuits.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

As the amount of global data grows, semiconductor chip manufacturers continue to develop advanced chips and devices with high-bandwidth network input-output (IO) capabilities. Such high-bandwidth chips and devices may include processors for computer systems, motherboard chips, network interface controllers and integrated circuits (ICs), graphics chips, embedded processors and other devices that may be related to high-speed computing and/or electronic communications.

Chips and devices with high-bandwidth network IO may rely on fast links with high bandwidth, low latency, and scalability. However, timely error detection and handling of the network IO on a system that may change—for example, that may contain programmable logic circuitry that can be reconfigured—over time may be challenging. For example, a system may include a component (e.g., system-on-chip (SoC) die) having configurable core logic. A user may reconfigure some of the core logic to support new applications. The reconfiguration may not be compatible with an existing error handling scheme and reconfiguring the existing error handling scheme may be difficult for the user.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

As application-driven businesses evolve, semiconductor chip manufacturers are continually focused on programmable or configurable semiconductor devices (e.g., chips). The programmable chips may include programmable logic (PL) components and programmable interconnects that allow users to program or reconfigure certain circuit(s) to perform functions (e.g., logical operations) for specific applications after chip manufacturing. For example, the programmable logic components may be programmed to duplicate functionalities of basic logic gates such as AND, OR, XOR, NOT or more complex combinational functions such as encoders or decoders. The programmable logic components may also include various peripheral circuits such as memory elements, IO elements, transceivers, and so on. For example, the memory elements may include simple flip-flops or more complete blocks of memories.

The programmable chip may be a monolithic die or part of a multi-chip package (MCP). An MCP is an electronic assembly on which multiple integrated circuits (ICs or chips), semiconductor dies and/or other discrete components may be integrated. The individual chips or semiconductor dies may be split into smaller chiplets or dies to facilitate performance improvement and reduce cost. For example, smaller chiplets or dies may enable more transistors to split across multiple chiplets easily so that more ICs can be put on one wafer. Smaller chiplets or dies may also facilitate modular circuit designs. Additionally, smaller chiplets or dies may have reduced risks of being defective due to an introduction of unwanted materials during semiconductor fabrication of the smaller chiplets or dies.

A semiconductor die (referred to as a die for simplicity) in the context of an integrated circuit (IC) is a small block of semiconducting material on which a given functional circuit is fabricated. For example, an SoC die may integrate multiple components of computing devices into a single microchip. The multiple components may include a core logic (e.g., a CPU) and peripherals such as memory, graphic interfaces, IO ports, and other relevant elements. A more tightly integrated system design in the SoC die may improve performance, reduce cost (e.g., by reducing power consumption), and enable efficient integration across different components of the SoC die. Another example is a network IO die that may be used to handle intercommunications between different dies to maintain a high-bandwidth, low latency, and flexible or scalable network IO.

In some embodiments, the core logic in the SoC die may include a semiconductor intellectual property (IP) core of a programmable logic device, such as a field-programmable gate array (FPGA). IP cores serve for chip design the same purpose as libraries serve for computer programming. IP cores may be used as building blocks within the FPGA logic designs. IP cores may include reusable units of logic, cell, or chip layout design that may be owned and used as intellectual properties by an entity. In some embodiments, IP cores may be licensed to another entity that may reprogram or reconfigure the IP cores for specific applications.

An FPGA is a type of Very Large Scale Integration (VLSI) circuit that is programmable (and reprogrammable) in the field (e.g., after FPGA manufacturing). For example, an FPGA may be reconfigured by using certain programs that may be downloaded to the FPGA from a host computer system. FPGAs are becoming an increasingly valuable implementation medium for digital logic.

FPGAs may include IP such as soft macros and hard macros. Soft macros are often used in SoC implementations. Soft macros are in synthesizable register transfer level (RTL) form and more flexible than the hard macros in terms of reconfigurability. Soft macros may not be specific to any manufacturing process and may be unpredictable in terms of timing, area, performance, or power. Soft macros may carry greater IP protection risks because RTL source code is more portable and, therefore, less easily protected than either a netlist or physical layout data. In placement and routing tools, soft macros may be any logic or cell that can be placed and routed. In some cases, the soft macros may be editable and may contain standard cells, hard macros, or other soft macros.

In comparison to soft macros, hard macros are generally in hardware IP forms. Hard macros may be specific to certain IC manufacturing processes. Hard macros are block level designs optimized for timing, area, power, or testing. Unlike the soft macros that are reconfigurable (e.g., reprograming the RTL), a user may only access certain parts (e.g., pins) of the hard macros. Hard macros may be generated in a methodology other than placement and routing.

An FPGA may include programmable components such as programmable logic (PL) blocks and programmable interconnects. The PL blocks may be programmed to duplicate the functionality of basic logic circuits (e.g., logic gates such as AND, OR, NOT, NAND, NOR, EOR, and ENOR) or more complex functions (e.g., coding, decoding). The PL blocks may also include memory blocks (e.g., simple flip-flops or more complete blocks of memories). The programmable interconnects may allow the PL blocks of an FPGA to be interconnected as desired by users. The PL blocks and programmable interconnects may be programmed after the manufacturing process by users such that the FPGA may perform different logical functions specified by the users.

An error handling scheme (such as error detection and correction) may be implemented for the FPGA to ensure the speed and accuracy of data communications among internal components of the FPGA and between the FPGA and associated peripheries (e.g., memories, transceivers) or other dies (e.g., IO die). Semiconductor chip manufacturers may face new challenges due to increasing complexities related to reconfigurations of the FPGA and associated peripheries. For example, the error handling scheme may be implemented by deploying Error Correction Code (ECC) encoders and decoders inside the FPGA. A user may combine multiple reconfigurable components (e.g., memories, transceivers) to form a new (e.g., wider) interface. The ECC encoders and decoders deployed inside the FPGA may have certain limitations (e.g., area utilization, timing closure) due to long wire routings (e.g., routings between external memories and the ECC encoders and decoders) and routing congestions (e.g., congestions at the ECC encoders and decoders). A modular ECC scheme may be applied to the FPGA to reduce issues such as wire routing and routing congestion. The modular ECC scheme may be implemented by deploying modular ECC encoders or decoders inside the FPGA and close to the reconfigurable components outside the FPGA. For example, a large amount of data bits will be processed by modular ECC encoders/decoders that are close to the reconfigurable components outside the FPGA, only a small amount of data bits (e.g., error check bits) will be transmitted to the ECC encoders/decoders that are located inside the FPGA. As such, the issues associated with long wire routings and routing congestions may be reduced by using the modular ECC scheme.

Figure 1:
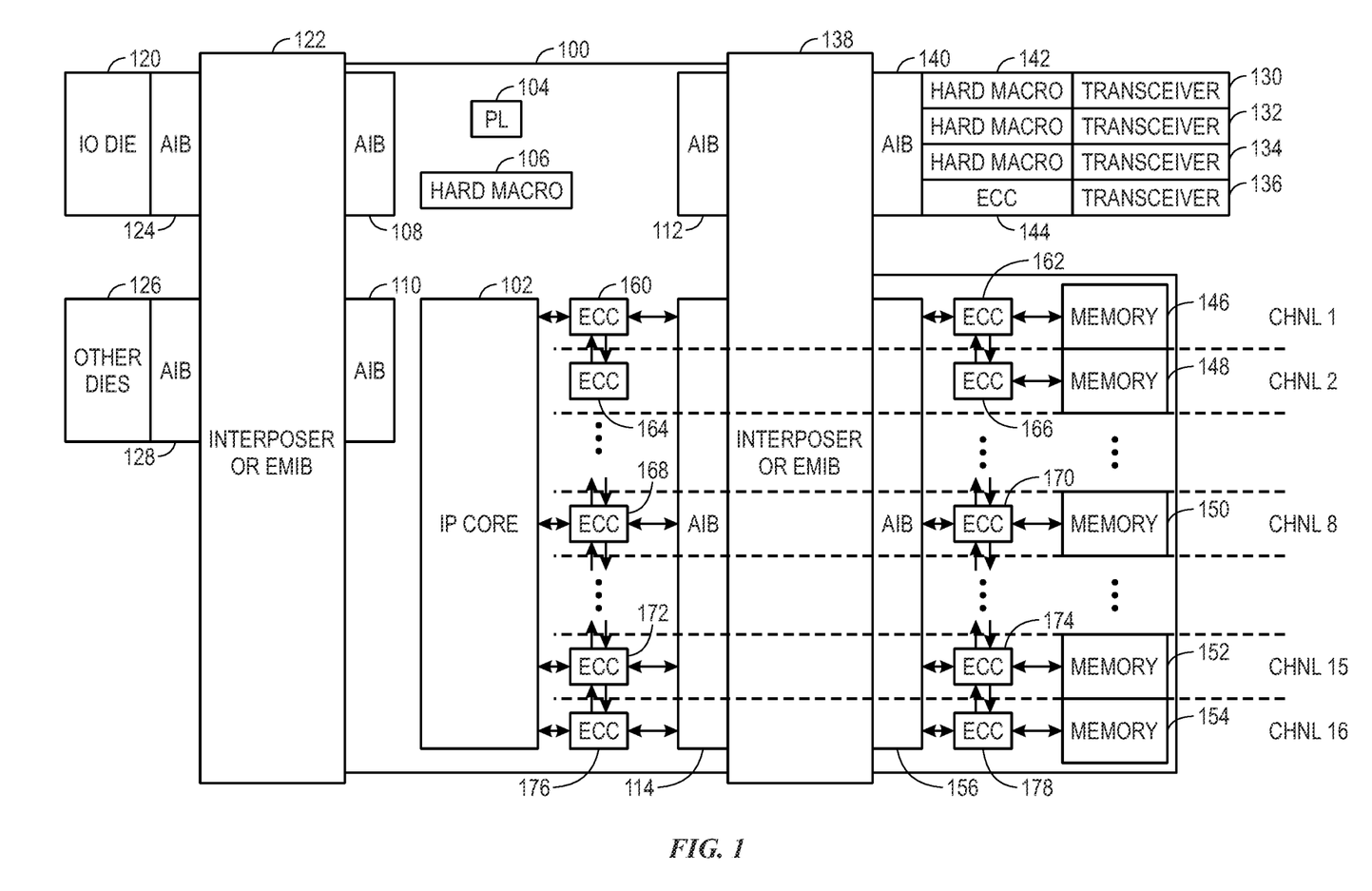
FIG. 1 illustrates a block diagram of an example of a modular Error Correction Code (ECC) scheme in a field-programmable gate array (FPGA), in accordance with an embodiment.

With the foregoing in mind, FIG. 1 illustrates a block diagram of an example of a modular Error Correction Code (ECC) scheme in a field-programmable gate array (FPGA). An FPGA 100 may include an IP core 102, one or more programmable logic (PL) blocks 104, one or more hard macros 106, and multiple Advanced Interface Buses (AIBs) 108, 110, 112, and 114. The FPGA 100 may communicate with other dies and peripheries located on the same multi-chip package (MCP). For example, the FPGA 100 may communicate with an IO die 120 via the AIB 108, an interposer 122 (or Embedded Multi-die Interconnect Bridge (EMIB)), and an AIB 124. The FPGA may also communicate with other dies 126 via the AIB 110, the interposer 122, and an AIB 128. In some cases, the FPGA 100 may also communicate with various peripheries (e.g., transceivers 130, 132, 134, and 136, memories 146, 148, 150, 152, and 154).

The FPGA 100 may be designed as reconfigurable integrated circuitry allowing users (e.g., customers or designers) to reconfigure or reprogram it after being manufactured. For example, the FPGA 100 may be reconfigured or reprogrammed to meet customer-defined application or functionality requirements after manufacturing. A configuration of the FPGA 100 may be specified using hardware description language (HDL) or other suitable electronic design automation tools. The configuration of the FPGA 100 may specify structures and behaviors of electronic circuits (e.g., logic circuits) within the FPGA 100.

HDL is a specialized computer language that may be used to describe the structure and behavior of electronic circuits. HDL may enable a precise description of an electronic circuit that allows for the automated analysis and simulation of an electronic circuit. HDL may also allow for the synthesis of an HDL description into a netlist (a specification of physical electronic components and how they are connected together), which can then be placed and routed to produce the set of masks used to create an integrated circuit. HDL forms an integral part of electronic design automation (EDA) systems, especially for complex circuits, such as application-specific integrated circuits, microprocessors, and programmable logic devices.

The IP core 102 may be any type of IP core logic device that is programmable. The IP core 102 may include reusable unit(s) of logic, cell, or chip layout design. In one embodiment, the IP core 102 may be owned by one entity and may be licensed to another entity such that the IP core 102 can be reprogrammed or reconfigured after manufacturing. For example, another entity may reconfigure the IP core 102 within a logic design of the FPGA 100 to implement specific applications (e.g., customer-defined application) or functionalities.

The PL blocks 104 may be programmed to duplicate the functionality of basic logic gates such as AND, OR, and XOR gates or more complex functions such as coding and decoding. In some embodiments, the PL blocks 104 may include memory blocks (e.g., simple flip-flops or more complete blocks of memories). The hard macros 106 may include IP blocks each performing a fixed function with faster speed than a reconfigurable logic and less area. For example, the hard macros 106 may include Block RAM (BRAM), Digital Signal Processor (DSP) slices, and the like. BRAM is a type of random access memory (RAM) embedded throughout the FPGA 100 for data storage. DSP slices may provide signal processing functions for the FPGA 100.

Advanced Interface Bus (AIB) or any other suitable system (e.g., Universal Interface Bus (UIB), Bunch of Wires (BoW), Infinity Fabric on Package (IFOP)) may be used to provide a die-to-die physical layer (PHY) level standard that enables a modular approach to system design with a library of chiplet intellectual property (IP) blocks. Using AIB as an example, AIB may use a clock forwarded parallel data transfer mechanism similar to Double Data Rate Synchronous Dynamic Random-Access Memory (DDR DRAM) interfaces. AIB may allow users (e.g., design methodologies or service providers, foundries, packaging providers, or system vendors) to implement different integrated circuit designs with flexible intercommunications between different components that may come from various manufacturers.

The interposer 122 may serve as an electrical interface routing between one socket or connection (e.g., AIB 108) and another (e.g., AIB 124). The interposer 122 may spread a connection to a wider pitch or to reroute a connection to a different connection. In some embodiments, an Embedded Multi-die Interconnect Bridge (EMIB) by Intel Corporation may be used additionally or alternatively to the interposer 122 with similar bandwidth but less cost. The EMIB may use less silicon in routing layers that connects one die to another in an MCP.

The AIBs (e.g., AIBs 108, 110, 112, and 114) may provide high-bandwidth and low-latency multi-channel physical layer (PHY) for interconnecting the FPGA 100 with other dies (e.g., IO die 120, other dies 126) mounted on the same MCP. The IO die 120 may be used to handle intercommunications between different dies to maintain a high-bandwidth, low latency, and flexible or scalable network TO. For example, the IO die 120 may be a network IO die that provides high bandwidth throughput for the FPGA 100 to and/or from the other dies or devices (e.g., peripheries) located on the same MCP. In some embodiments, the IO die 120 may include another interconnect bus (IB) and/or a silicon photonics (SiPh) interface. The IB may be any suitable die-to-die interconnect that may provide a high-bandwidth and low-latency multi-channel physical layer (PHY) for interconnecting multiple dies mounted within the same MCP. The SiPh interfaces may be a network IO chiplet that uses optical links for data transmission with low decibel (dB) loss with a low energy cost. The SiPh interface may be integrated into an MCP to provide a high-bandwidth throughput for intercommunications between the FPGA 100 and other SoC die within the same MCP.

AIB circuitry (e.g., AIBs 108, 110, 112, and 114) may also provide a high-bandwidth and low-latency multi-channel PHY for interconnecting FPGA 100 with various peripheries. For instance, peripheries may include IO elements and memory elements. The IO elements may include high-speed optical transceivers such as silicon photonics transceivers. The memory elements may include simple flip-flops or more complete blocks of memory.

The FPGA 100 may communicate with multiple transceivers 130, 132, 134, and 136 via the AIB 112, an interposer 138 (or EMIB), and an AIB 140. Additionally or alternatively, certain intermediate components may be placed between the multiple transceivers and the AIB 140. For instance, a hard macro 142 may be placed between the AIB 140 and the transceiver 130, and an ECC decoder 144 may be placed between the AIB 140 and the transceiver 136 to handle error detections and corrections.

The FPGA 100 may also communicate with multiple memories such as memories 146, 148, 150, 152, and 154 via the AIB 114, the interposer 138 (or EMIB), and an AIB 156. For example, a user may reconfigure the FPGA 100 in a way to communicate with some number of memories (e.g., 16 memories from memory 146 to memory 154) that can be combined to form a wider data interface. The IP core 102 may communicate with the memories via a multi-channel Advanced Interface Bus (AIB) link. Each channel may include an ECC encoder and an ECC decoder to handle error detections and corrections. For instance, a first channel (referred to as CHNL 1) may include an ECC encoder 160 and an ECC decoder 162 to handle error detection and correction for communications between the IP core 102 and the memory 146. Similarly, ECC encoders 164, 168, 172, and 176, and ECC decoders 166, 170, 174, 178 in respective channels (e.g., CHNLs 2, 8, 15, 16) provide error handlings for the IP core 102 and corresponding memories (e.g., memories 148, 150, 152, 154). The multi-channel AIB link will be described below in more detail with respect to FIG. 5.

For the FPGA 100, the peripheries (e.g., transceivers 130 and 132, memories 146 and 148) may be built in a modular fashion as illustrated in FIG. 1. Each periphery may support a fixed number of I/Os. For example, each memory (e.g., memory 130) may support up to 24, 48, 96, or 128 I/Os, or the like. For an application that requires a wider interface on the FPGA 100, the user may reconfigure the FPGA 100 to combine multiple memories (e.g., memories 146, 148, 150, 152, and 154) to form a wider interface. Such reconfiguration may be applied to other peripheries such as the transceivers 130, 132, 134, and 136 as well.

The reconfiguration of the FPGA 100 may include one or more error handling schemes to ensure a reliability of the reconfigured FPGA 100 associated with the peripheries and to facilitate troubleshooting and diagnosis. In some embodiments, an error recovery scheme such (e.g., Error Correction Code (ECC) scheme) may be used in memory (e.g., DDR, flash) or communication protocols (e.g., wireless protocols). The ECC implementation in the FPGA 100 may use Single-bit Error Correction, Double-bit Error Detection (SECDED) code (such as Hamming or Hsiao code) to provide error handlings. SECDED code use an H-matrix as a parity check matrix. Hamming code is a linear error-correcting code that can detect up to two-bit errors or correct one-bit errors without detection of uncorrected errors. Hsiao code may provide certain advantages such as area and fMAX due to balance matrices.

In one example, an ECC configuration for external memory (e.g., DDR) may include 64 data bits and 8 parity bits. Parity checking is a technique that checks whether data has been lost or written over when the data is moved from one place in storage to another or when the data is transmitted between individual IP blocks. For example, data transmission may not be an error-free process and the data received by a target IP block may not be in the same way as the data was transmitted from a source IP block. Parity bits may add checksums into data to enable the target IP block to determine whether the data was received correctly. In a 64/8 configuration, 64-bit data is encoded into 72-bit data by adding an additional 8 bits of parity capable of SECDED.

To support data with different widths (e.g., 8, 16, 32, 64, 128, 512, or 1024, or more bits), different topologies of the peripheries may be used. For example, to create a 64-bit data interface on the FPGA 100, the user may combine three memories (e.g., memories 146, 148 and 150) to create the 64-bit data interface. As such, ECC logic (e.g., ECC decoder) may use all data to compute parity information. For example, for the 64-bit data interface, all 64-bit data may be used to compute 8-bit parity.

Two different approaches may be used to implement the ECC scheme for the FPGA 100 and the associated peripheries. In a first approach, ECC logic circuitry (e.g., ECC encoder/decoder) may be implemented inside the FPGA 100. In the example of 64-bit data interface described above, the interfaces of three memories (e.g., memories 146, 148 and 150) may be combined to form a wider memory interface. As mentioned previously, the ECC logic may use all data to compute parity information. Thus, data from all three memories will be routed to the ECC logic implemented inside the FPGA 100 for parity computation. This approach may have certain limitations (e.g., area utilization, timing closure) in applications (e.g., wide memory interfaces) due to long wire routings and routing congestions.

Wire routing congestion occurs on a SoC die when a lot of wires (e.g., metal lines) are routed in a narrow space. In some cases the wire routing congestion becomes difficult to avoid because the wires have to be routed in a limited space (e.g., white space) between IP block restrictions. For example, the use of the ECC logic inside the FPGA 100 may create routing congestions because data from tile IPs (e.g., peripheries such as transceivers 130 and 132, memories 146 and 148) will travel to the FPGA 100 directly. However, the data will also need to travel to the ECC logic located inside the FPGA 100 for ECC computation. That is, data from all peripheries will have to converge at the ECC logic for parity checking.

To reduce or avoid wire routing congestion, in a second approach, the ECC scheme may be implemented in both the FPGA 100 and tile IPs (e.g., peripheries such as transceivers 130 and 132, memories 146 and 148) by using modular ECC encoders/decoders, as illustrated in FIG. 1. Each ECC module may perform ECC computation (encoding and decoding) associated with a respective tile IP and only the parity bits are converged to a default ECC module for final ECC computation. For example, ECC decoders 162, 166, 174, and 178 may perform local ECC computations associated with the memories 146, 148, 152, and 154 respectively. Only the parity bits from the ECC decoders 162, 166, 174, and 178 may be transmitted to the default ECC (e.g., ECC decoder 170) for final ECC computation.

With the modular ECC implementation, the ECC computations involving comparatively large numbers of data bits may be performed locally at individual ECC modules and only a small number of parity bits may be transmitted into a default ECC module for final ECC computation, thereby reducing wire routing track. The modular ECC implementation may only use convergence of parity bits to perform ECC encoding and decoding, thereby reducing the wire routing congestion issue without sacrificing performance in other areas (such as latency, computation bandwidth).

The modular ECC implementation described herein may exploit block matrix properties in the ECC scheme. A block matrix (or partitioned matrix) is a matrix that is interpreted as having been broken into sections (e.g., smaller rectangular matrices) called block matrices or blocks. These blocks may be combined back into a block matrix. By dividing a large matrix into blocks, and treating each block as an element of another matrix, a large, sophisticated calculation may be performed by using smaller blocks with simplified or more efficient algorithms. The matrix partitioning may make the sophisticated calculation more clear or simplified. The modular ECC implementation may use matrix partitioning to break down a large matrix, such as a parity check matrix (e.g., H-matrix used in the SECDED code), into smaller matrices (block matrices) for parity computations. That is, the parity computations performed by a single ECC encoder/decoder associated with a large H-matrix may be equivalently performed by a group of modular ECC encoders/decoders associated with a group of smaller matrices. As described previously, certain issues (e.g., long wire routing, routing congestion) related to the use of a single ECC encoder/decoder for error handling may be reduced or avoided by using modular ECC encoders/decoders deployed closer to the units for which the modular ECC encoders/decoders will provide error handling.

In an embodiment, a generator matrix G and a parity check matrix H may be partitioned to perform an ECC scheme. The generator matrix G is a liner code that may be expressed as:

$$G = [I_k \mid P] = \begin{bmatrix} I1 & p1 \\ I2 & p2 \\ \ldots & \ldots \\ Im & pm \end{bmatrix}, \text{ where } I_k = \begin{bmatrix} I1 \\ I2 \\ \ldots \\ Im \end{bmatrix} \text{ and } P = \begin{bmatrix} p1 \\ p2 \\ \ldots \\ pm \end{bmatrix} \quad (1)$$

A linear code is an error-correcting code for which any linear combination of codewords is also a codeword. The generator matrix G may be partitioned into block matrices. When multiplying partitioned matrices, basic rules of matrix multiplication can be applied to the block matrices as though they were single elements. A codeword x may be generated as:

$$x = aG = a[Ik \mid P] = [ac] \quad (2),$$

where a is data matrix and c is parity matrix.

The codeword x may be partitioned into block matrices as expressed in the following equations:

$$x = [a_1 \; a_2 \ldots a_m] \begin{bmatrix} I1 & p1 \\ I2 & p2 \\ \ldots & \ldots \\ Im & pm \end{bmatrix}, \quad (3)$$

-continued $$x = [a_1][\,I1 \quad p1\,] + [a_2][\,I2 \quad p2\,]... + [a_m][\,Im \quad pm\,], \quad (4)$$

$$x = x_1 + x_2 ... + x_m, \text{ where } x_1 = [\,a_1 \quad c_1\,], \quad (5)$$
$$x_2 = [\,a_2 \quad c_2\,], x_m = [\,am \quad cm\,].$$

Therefore, the ECC scheme (e.g., encoding scheme) may have data bits ($a_1$, $a_2$ ... $a_m$) and parity bits ($c_1$, $c_2$ ... $c_m$) transmitted in separated channels ($x_1$, $x_2$ ... $x_m$). The parity bits may be converged as:

$$c = [c_1 + c_2 ... + c_m] \quad (6).$$

The parity bits may be transmitted from any channel and converged in a default channel. For example, if the parity bits are transmitted to the default channel $x_1$, the codeword x may be expressed as:

$$x = r = [a_1 C] + [a_2 Z] + ... + [a_m Z] = r_1 + r_2 + ... + r_m,$$
$$\text{where } r_m \text{ is transmitted } x_m \quad (7).$$

A parity check matrix H may be expressed as:

$$H = [P^T | I_n] \quad (8).$$

The parity check matrix H may be partitioned into block matrices as $H = [p_1 \, p_2 \, ... \, p_n | i_1 \, i_2 \, ... \, i_n]$, where ($i_1, i_2 ... i_n$) are identity block matrices of $I_n$ and ($p_1, p_2 ... p_n$) are block matrices of $P^T$. The parity check matrix H may be rewritten as:

$$H = h_1 + h_2 + ... + h_n \quad (9),$$

where:

$$h_1 = [p_1 Z_2 Z_3 ... Z_n | i_1 Z_2 Z_3 ... Z_n] \quad (10),$$

$$h_2 = [Z_1 p_2 Z_3 ... Z_n | Z_1 i_2 Z_3 ... Z_n] \quad (11),$$

$$h_n = [Z_1 Z_2 Z_3 ... p_n | Z_1 Z_2 Z_3 ... i_n] \quad (12),$$

where ($Z_1$, $Z_2$ ... $Z_n$) are null matrices.

Thus, a syndrome bit z that is used to identify a bit in error may be expressed using the parity check matrix H and the codeword r as follows:

$$z = Hr = (h_1 * r_1^T + h_2 * r_2^T + ... + h_n * r_n^T) \quad (13).$$

Figure 2:
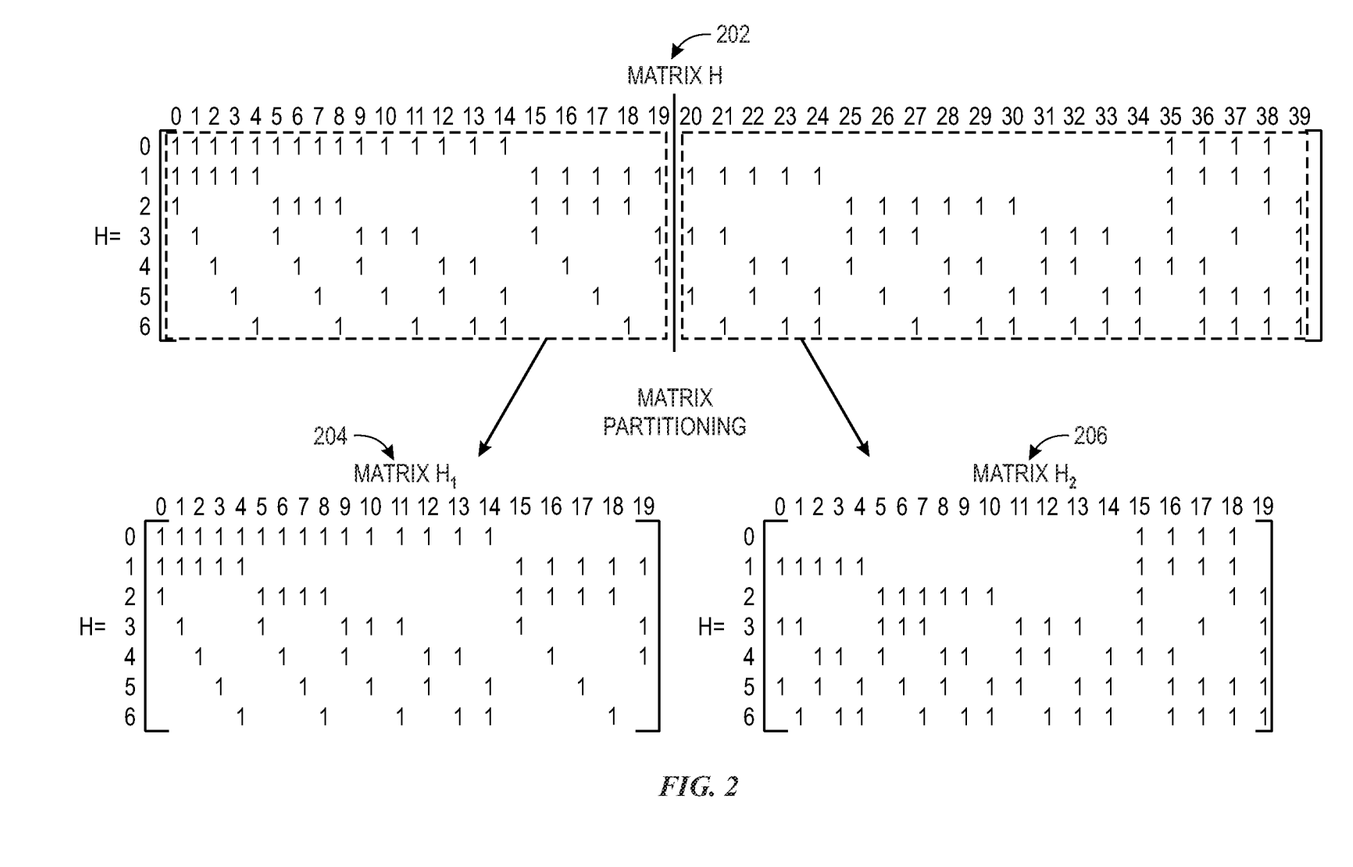
FIG. 2 illustrates an example of an ECC matrix that is partitioned into two block matrices for the modular ECC scheme of FIG. 1, in accordance with an embodiment.

With the foregoing in mind, FIG. 2 illustrates an example ECC matrix that is partitioned into two block matrices for the modular ECC scheme described previously in FIG. 1. This matrix partitioning may allow each ECC to be encoded independently before converging. In the current example, a larger H-matrix 202 is split, via a matrix partitioning process, into two smaller block matrices 204 and 206. As mentioned above, the larger H-matrix 202 may be a parity check matrix corresponding to a single ECC encoder/decoder implemented in the FPGA 100 that uses a convergence of data from other devices or components (e.g., peripheries) to perform error detections and corrections. The smaller block matrices 204 and 206 after matrix partitioning may be those smaller block matrices (e.g., H-matrix) corresponding to respective ECC modules (e.g., ECC encoders 160, 164, 168, 172, and 176, or ECC decoders 162, 166, 170, 174, and 178) each may use a small amount of parity bits to perform ECC encoding and decoding locally (e.g., close to the units for which the modular ECC encoders/decoders will provide parity checking.) Using modular ECC implementation may achieve same or similar functionalities as using an ECC logic (e.g., ECC encoder/decoder) in the FPGA 100 for parity checking, but with reduced wire routing congestion and without sacrificing performance in data latency, computation bandwidth, and so on.

Figure 3:
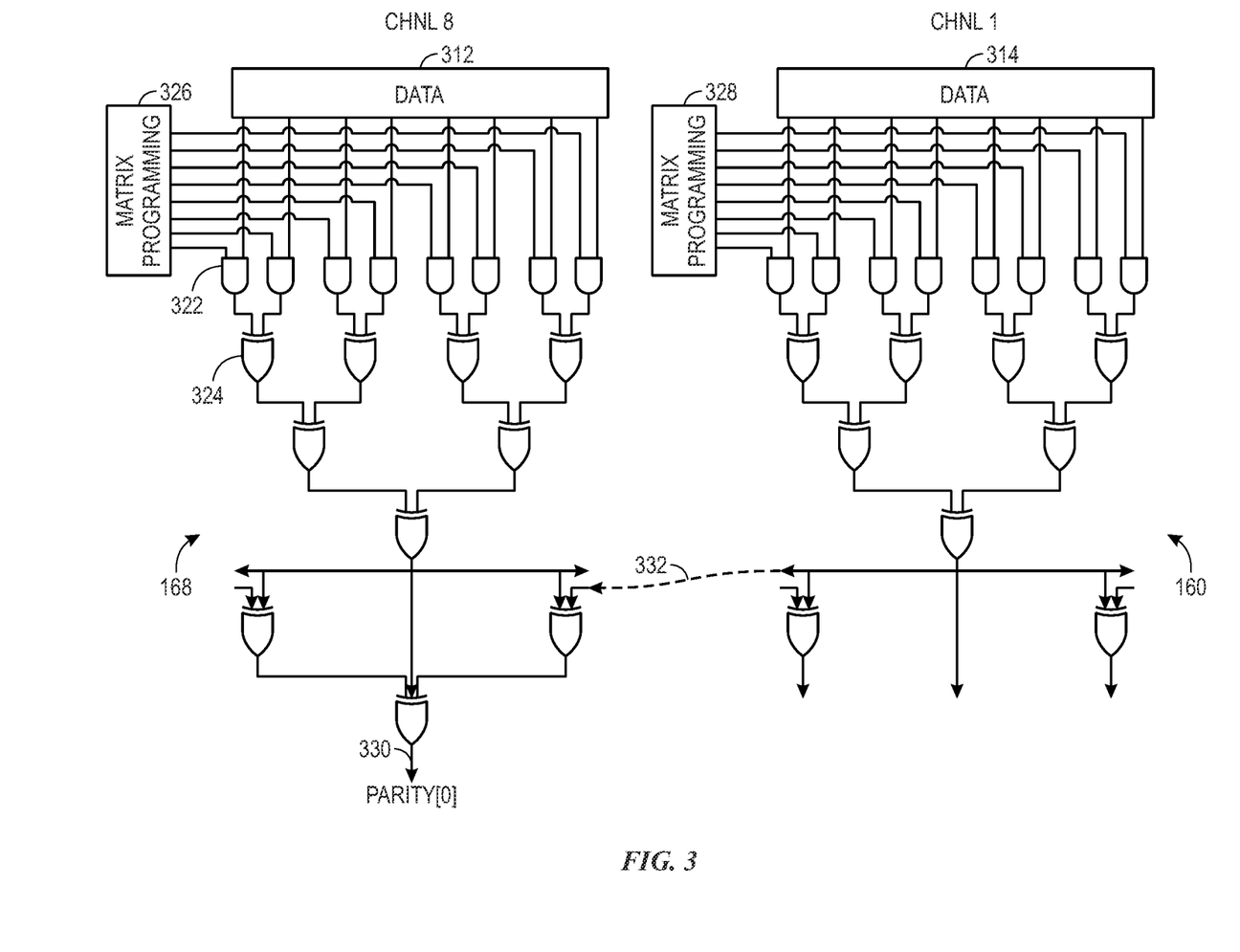
FIG. 3 illustrates an example logic circuit design corresponding to the partitioned block matrices of FIG. 2, in accordance with an embodiment.

FIG. 3 illustrates an example logic circuit design corresponding to the partitioned block matrices of FIG. 2. The multi-channel Advanced Interface Bus (AIB) link of FIG. 1 is used herein to demonstrate the example ECC circuit design. For simplicity, a portion of the channels (e.g., two channels) is used in current example. In an embodiment, a user may reconfigure the FPGA 100 by combining two data channels (e.g., CHNL 8 and CHNL 1) to form a new data channel with wider data interface. The CHNL 8 and CHNL 1 may be configured to transport data 312 and 314, respectively. The ECC encoder 168 in CHNL 8 may be implemented by a first group of logic circuits that may correspond to the block matrix 204. The ECC encoder 160 in CHNL 1 may be implemented by a second group of logic circuits that may correspond to the block matrix 206. The first group of logic circuits and second group of logic circuits may include numerous logic circuits such as AND logic gate 322 and XOR logic gate 324. The parity bits may be transmitted from one data channel to the other data channel via a parity link. For example, if CHNL 8 is configured as a default data channel, the parity bit generated from CHNL 1 will be transmitted via a parity link 332 to CHNL 8 for parity computations. The parity bit 330 output from CHNL 8 may be sent to the IP core 102.

The first group of logic circuits implemented for ECC encoder 168 in CHNL 8 and the second group of logic circuits implemented for ECC encoder 160 in CHNL 1 may be reconfigured by a user via matrix programing logic circuitry 326 and 328, respectively. For example, by disabling certain XOR logic circuits (e.g., XOR logic gate 324) to change between logic 0 and 1, the first and second group of logic circuits will be reconfigured to respective ECC encoder configurations based on the block matrices 204 and 206 respectively. Such reprogramming or reconfiguration may allow each data channel to be flexible for different applications. Additionally, since the number of modular ECCs is related to the matrix partitioning of the larger H-matrix 202, the reprogramming or reconfiguration may allow variable data channels to be implemented to support different applications.

The matrix programming logic circuitry 326 or 328 may include configuration registers that can store the values of the block matrices 204 and 206. The configuration registers may be programmed during configuration or reconfiguration of the FPGA 100. The stored values of the block matrices 204 and 206 effectively define the operation of the ECC encoder (e.g., encoder 160 or 168) by providing the values of the block matrices 204 and 206 to respective logic circuits of the ECC encoder (e.g., encoder 160 or 168). The matrix programming logic circuitry 326 or 328 may be communicatively connected to one or more processors (e.g., that may configure the FPGA 100) that may perform matrix manipulations such as generating the parity check matrix (e.g., H-matrix used in the SECDED code), partitioning the large H-matrix into smaller block matrices for parity computations performed by modular ECC logic circuit, programming the modular ECC logic circuits based on the matrix partitioning, and the like.

The one or more processors may include any type of computer processor or microprocessor capable of executing computer-executable code to perform the presently disclosed techniques. The one or more processors may access a memory and a storage that may be any suitable articles of manufacture serving as media to store computer-executable code and data (configuration of programmable logic circuitry, analysis of the data, or the like). The memory and the storage may represent non-transitory computer-readable media (i.e., any suitable form of memory or storage) that may store the computer-executable code used by the one or more processors to perform various techniques described herein. It should be noted that non-transitory merely indicates that the media is tangible and not a signal.

Figure 4A:
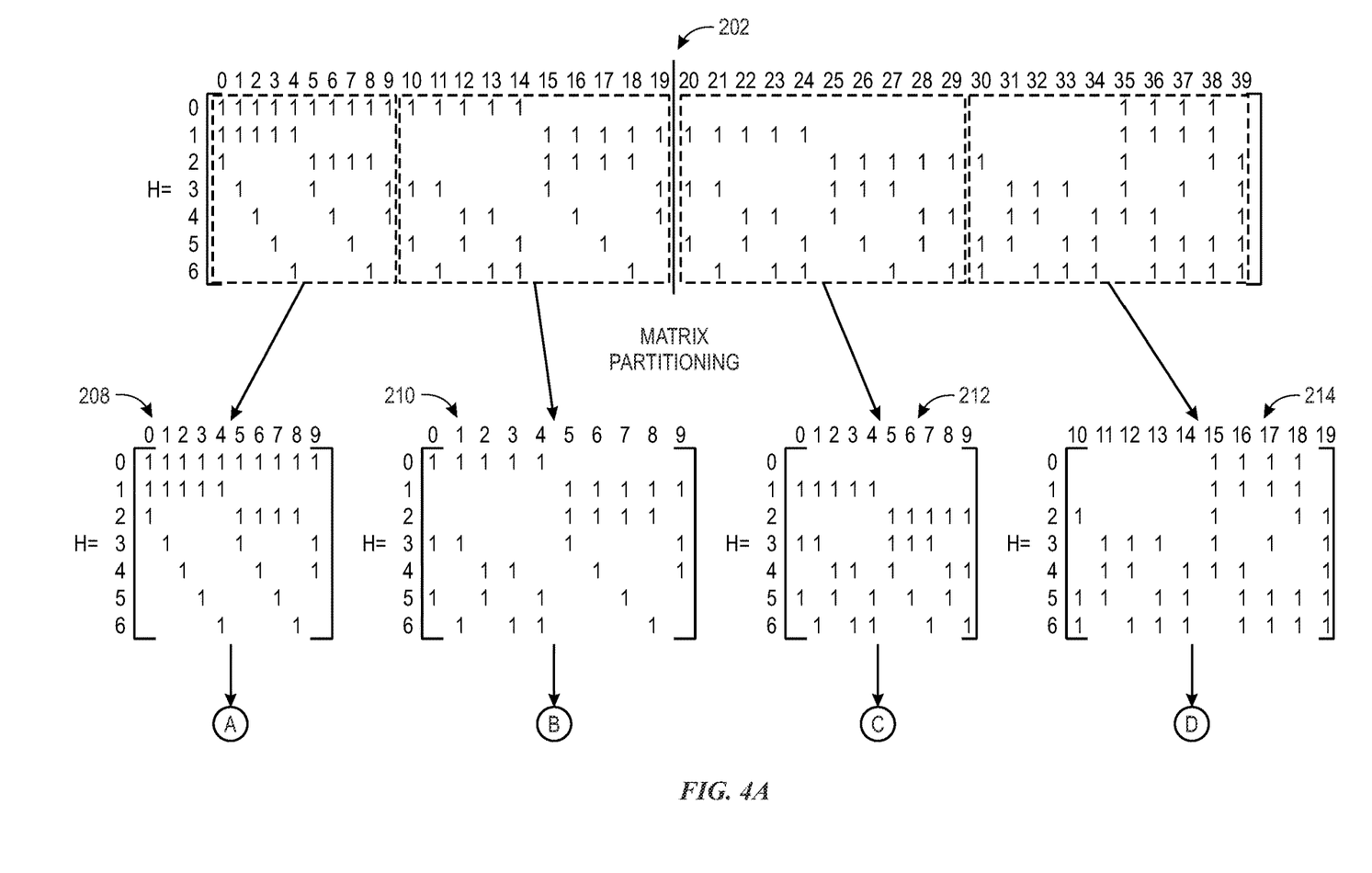
FIG. 4 illustrates another example logic circuit design based on matrix partitioning, in accordance with an embodiment.
Figure 4B:
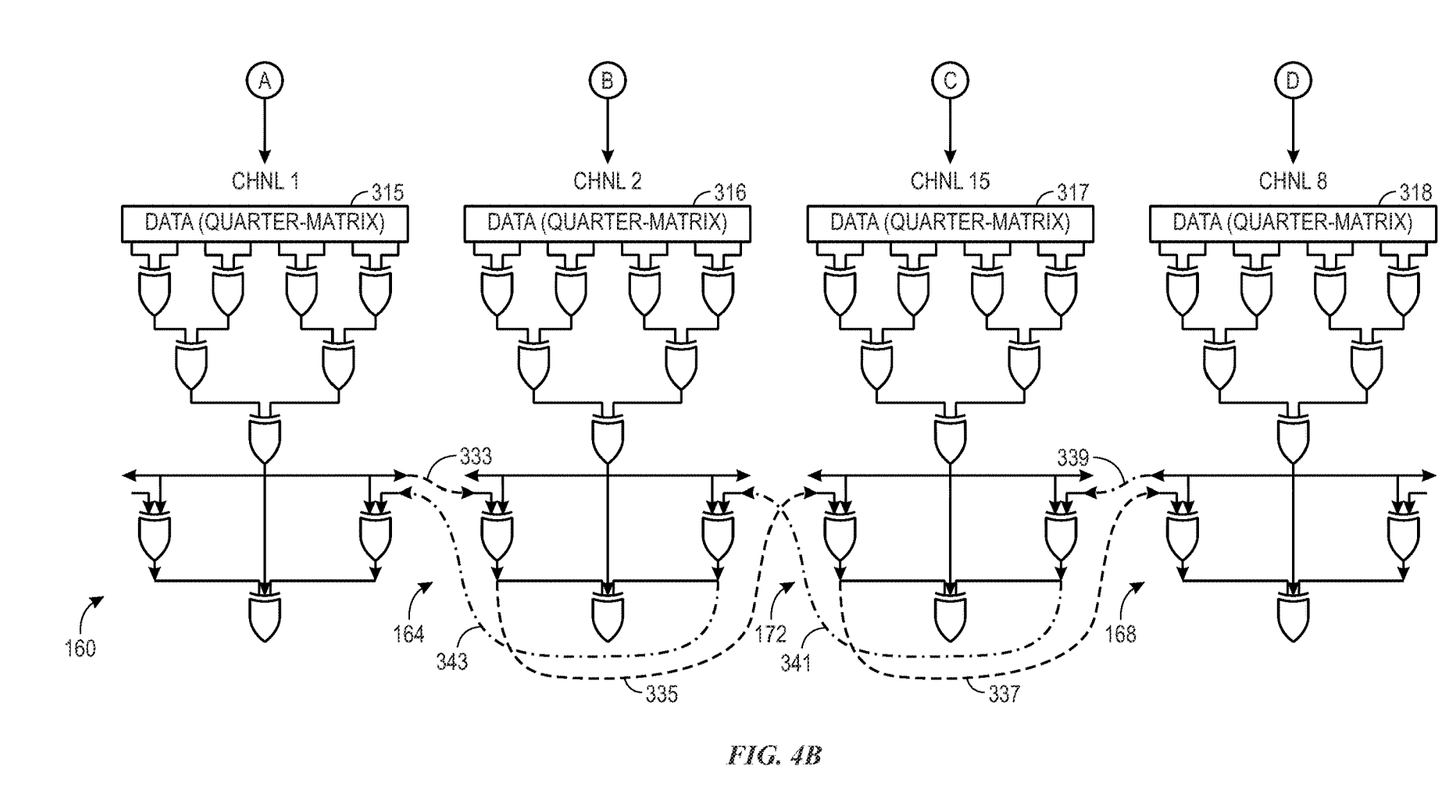

As mentioned above, the reprogramming or reconfiguration described herein may allow variable data channels to be implemented to support different applications. FIG. 4 illustrates another example logic circuit design based on matrix partitioning. A larger H-matrix 202 may be partitioned into four smaller block matrices 208, 210, 212, and 214. Correspondingly, four ECC encoders 160, 164, 168, and 172 may be implemented based on the four block matrices 208, 210, 212, and 214, respectively. The four ECC encoders 160, 164, 168, and 172 may provide parity checking for CHNL 1, CHNL 2, CHNL 15, and CHNL 8, respectively. The CHNL 1, CHNL 2, CHNL 15, and CHNL 8 may be configured to transport data 315, 316, 317, and 318, respectively.

The parity bits may be transmitted from one data channel to the other data channel via one or more parity links. For example, if the CHNL 8 is the default channel, the parity bit generated from CHNL 1 may be transmitted via a parity link 333 to CHNL 8, which may then transmit the parity bit via a parity link 335 to CHNL 15, which may further transmit the parity bit via a parity link 337 to CHNL 18 for parity computations. Similarly, if the CHNL 1 is the default channel, the parity bit generated from CHNL 8 will be transmitted via a parity link 339 to CHNL 15, which may then transmit the parity bit via a parity link 341 to CHNL 2, which may further transmit the parity bit via a parity link 343 to CHNL 1 for parity computations.

Although the parity transmission is described with respect to a serial transmission, it should be noted that the present embodiments described herein may be implemented in other methods of parity transmission such as broadcasting the parity from one data channel to other data channels.

Figure 5:
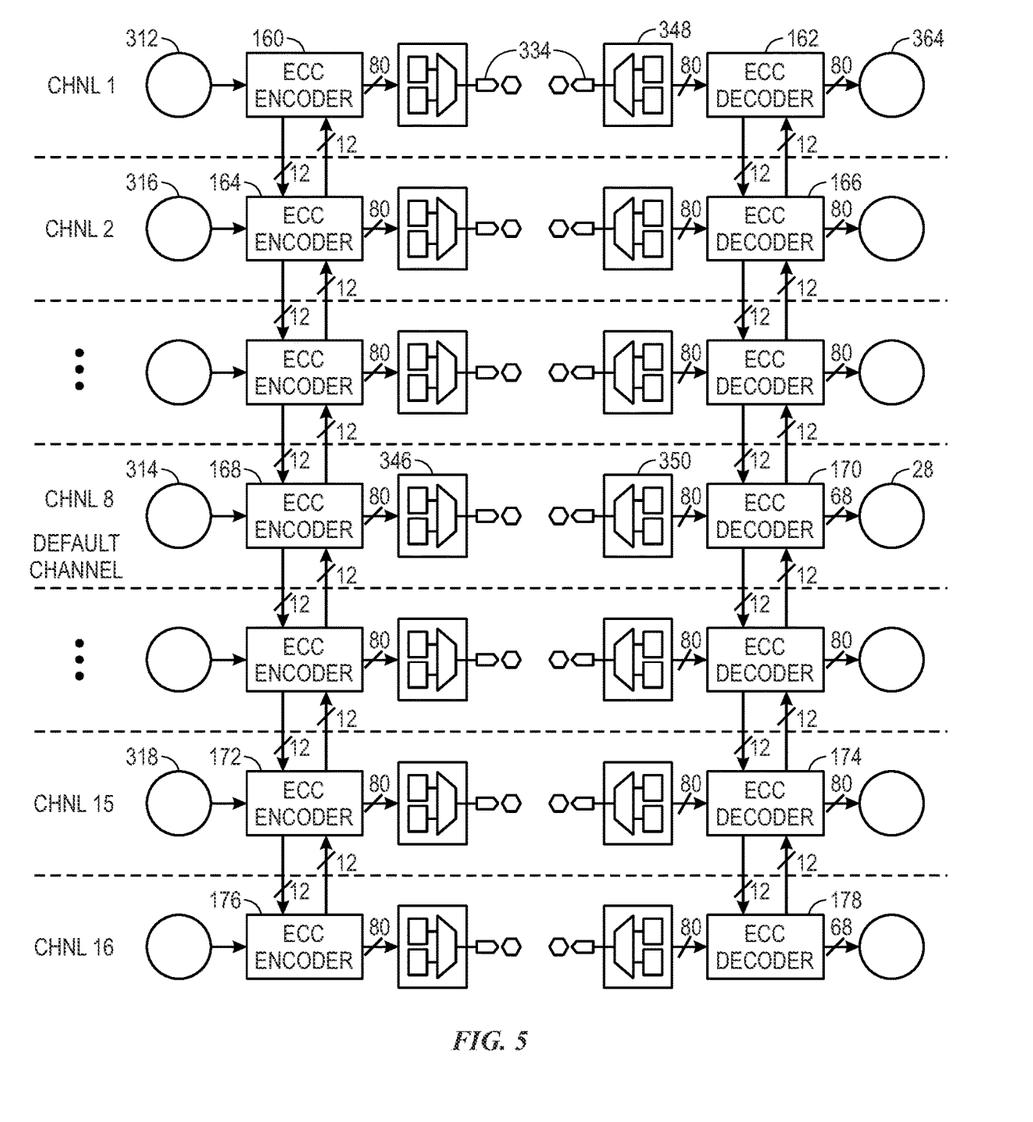
FIG. 5 illustrates an example circuit design of a 16-channel Advanced Interface Bus (AIB) implemented in the FPGA of FIG. 1, in accordance with an embodiment.

With the foregoing in mind, FIG. 5 illustrates an example circuit design of a 16-channel Advanced Interface Bus (AIB). Sixteen channels are combined to form a new data interface supporting a 1280 bits data bus including 12 bits parity and 1268 bits data. The 16-channel MB includes data channels such as CHNL 1, CHNL 2, CHNL 8, CHNL 15, CHNL 16, and so on. Each AIB channel may transmit some number of data bits and parity bits (e.g., 80 bits that include 72 bits of data and 8 bits of parity). Each 80 bits from a source device (e.g., IP core 102) may have been encoded by a corresponding ECC encoder (e.g., ECC encoders 160 and 168), multiplexed by a corresponding multiplexer (e.g., multiplexers 344 and 366), and transmitted via a corresponding channel to a target device (e.g., memory). The transmitted 80 bits may be demultiplexed by a corresponding demultiplexer (e.g., demultiplexers 348 and 350), decoded by a corresponding ECC decoder (e.g., ECC decoders 162 and 170), and restored to 72 bits that can be processed by the target device.

For example, 72-bit data 312 may be generated from the IP core 102 and then encoded by the ECC encoder 160. Including some number of additional parity bits (e.g., 8 parity bits), the total encoded data may be 80 bits. The encoded 80 bits is multiplexed by the multiplexer 344 and then transmitted via CHNL 1. IO buffers 334 may be used to temporarily store the transmitted data. The transmitted 80 bits may be demultiplexed by the demultiplexer 348, decoded by the ECC decoder 162, and restored to 72 bits that may be processed by the memory 146.

The multiplexer (e.g., multiplexer 344 or 366) may be any type of data selector that selects between several analog or digital input signals and forwards it to a single output line. A multiplexer may be used to increase the amount of data that can be sent over the network within a certain amount of time and bandwidth. In some embodiments, the multiplexer may also be used to implement Boolean functions of multiple variables.

The IO buffer (e.g., IO buffer 334) may provide IO buffering for temporarily storing data that is passing between a processor (e.g., processor of the IP core 102 and a peripheral circuit (e.g., memory 146)). The IO buffering may smooth out the difference in rates at which the processor and the peripheral circuit may handle data without latency or other issues.

In the present example, CHNL 8 is set as a default channel that transmits all the parity bits to the core logic (e.g., IP core 102) of the FPGA 100. That is, all other channels will propagate parity bits to CHNL 8. For example, channels that are above CHNL 8, such as CHNL 1 and CHNL 2, will propagate respective parity bits downward to CHNL 8. Channels that are below CHNL 8, such as CHNL 15 and CHNL 16, will propagate respective parity bits upward to CHNL 8. Such modular design enables parity bits to propagate upward or downward, thereby allowing flexible configuration of the default channel.

In addition to flexible configuration of the default channel, the parity check matrix (e.g., H-matrix 202) may be adjusted to variable block size. This allows for a flexible design for different block combinations. For example, the current 16-channel AIB with CHNL 8 as default channel may be reprogrammed to another 16-channel AIB with a different default channel (e.g., CHNL 2), or to two 8-channel AIBs that each has a respective default channel. By combing a modular ECC and programmable parity check matrix, each AIB channel may be programmable to be any H-matrix.

Figure 6:
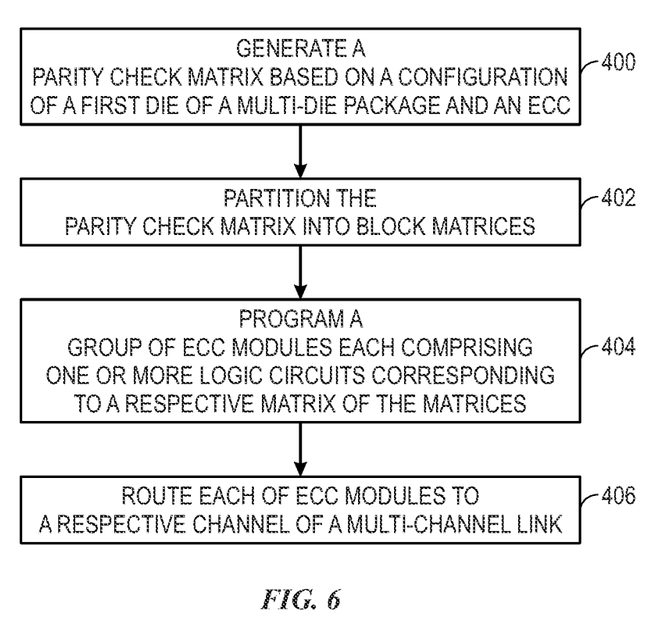
FIG. 6 illustrates a flow diagram of a process for providing error handlings in an integrated circuit device using modular ECC circuits, in accordance with an embodiment.

With the foregoing in mind, FIG. 6 illustrates a flow diagram of a process for providing error handlings in an integrated circuit device using modular ECC circuits. The integrated circuit device may include a multi-die package. The multi-die package may include a first die that is configurable (e.g., FPGA 100 or a die that includes). The first die may communicate with other dies and peripheries located on the multi-die package via a multi-channel link such as the multi-channel Advanced Interface Bus (AIB) link described in FIG. 1.

At process block 400, a parity check matrix may be generated based on a configuration of the first die of the multi-die package and an ECC. For example, a user may use one or more processors and a memory of a computing device to generate the parity check matrix. The memory may store the computer-executable code used by the one or more processors to perform various techniques described herein. The configuration of the first die is reconfigurable. The ECC is configured to handle error detection and correction for the multi-die package.

At process block 402, the parity check matrix may be partitioned into block matrices. The number of block matrices may be equal to the number of data channels in the multi-channel Advanced Interface Bus (AIB) link, which is reconfigurable to support different applications. This allows for a flexible design for different combinations of the block matrices.

At process block 404, a group of ECC modules that include one or more logic circuits corresponding to a respective matrix of the block matrices may be programmed. As described previously, the programming circuitry (e.g., matrix programing logic circuitry 326 and 328) may be used to reconfigure the group of ECC modules.

At process block 406, the ECC modules may be routed to a respective channel of the multi-channel link that transmits data bits and parity bits between the first die and a second die of the multi-die package. The multi-channel link may include a default channel. Respective ECC modules of the group of ECC modules may be associated with a respective channel of the multi-channel link. These may be configured to process a portion of the data bits transmitted via the respective channel. For example, an ECC module routed to the default channel may be configured to process the parity bits.

By distributing the ECC processing in this way, not only can the width of the interface be scaled up or down depending on the system design that is configured into the FPGA 100, but also the heat produced by such ECC processing may be distributed as well.

The systems and methods of this disclosure may be used in a data processing system or a component included in a data processing system. Such a data processing system may include a host processor (e.g., a central-processing unit (CPU)), memory and/or storage circuitry, and a network interface. The data processing system may include more or fewer components (e.g., electronic display, user interface structures, application specific integrated circuits (ASICs)). The host processor may include any suitable processor, such as an INTEL® Xeon® processor or a reduced-instruction processor (e.g., a reduced instruction set computer (RISC), an Advanced RISC Machine (ARM) processor) that may manage a data processing request for the data processing system (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry may include random access memory (RAM), read-only memory (ROM), one or more hard drives, flash memory, or the like. The memory and/or storage circuitry may hold data to be processed by the data processing system. In some cases, the memory and/or storage circuitry may also store configuration programs (bitstreams) for programming the integrated circuit device. The network interface may allow the data processing system to communicate with other electronic devices. The data processing system may include several different packages or may be contained within a single package on a single package substrate.

In one example, the data processing system may be part of a data center that processes a variety of different requests. For instance, the data processing system may receive a data processing request via the network interface to perform ASIC emulation, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

It should be noted that the features described in present disclosure, including the modular ECC implementation combined with the configurability of the core logic (e.g., the FPGA 100), may be implemented in any suitable integrated circuit (IC) dies that are communicatively coupled. That is, the FPGA core logic die and tile logic IC dies (e.g., memories, transceivers) are meant as examples. However, other suitable integrated circuits (e.g., CPU dies, GPU dies, dies containing other processing elements or arrays, ASICs) may use the modular ECC circuits of this disclosure.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

The following numbered clauses define certain example embodiments of the present disclosure.

EXAMPLE EMBODIMENT 1. A multi-die system, comprising:
    a first die comprising a core circuit and a peripheral circuit wherein a portion of the core circuit and a portion of the peripheral circuit are reconfigurable;
    a second die; and
    a multi-channel link configured to provide an interconnection between the first die and the second die, comprising:
        a plurality of channels configured to transmit a plurality of data bits and a plurality of parity bits, wherein a channel of the plurality of channels is a default channel; and
        a plurality of Error Correction Code (ECC) modules configured to provide error handling for the plurality of channels, wherein the error handling corresponds to a parity check matrix that is reconfigurable, wherein each of the plurality of ECC modules corresponds to a respective matrix of a plurality of matrices derived from partitioning the parity check matrix, wherein each of the plurality of ECC modules coupled to a respective channel of the plurality of channels is configured to processes a portion of the plurality of data bits transmitted via the respective channel, wherein an ECC module of the plurality of ECC modules coupled to the default channel is configured to processes the plurality of parity bits.

EXAMPLE EMBODIMENT 2. The multi-die system of example embodiment 1, wherein the core circuit comprises a field-programmable gate array (FPGA).

EXAMPLE EMBODIMENT 3. The multi-die system of example embodiment 2, wherein the FPGA and the plurality of ECC modules are programmable to accommodate different widths of the multi-channel link.

EXAMPLE EMBODIMENT 4. The multi-die system of example embodiment 1, wherein the peripheral circuit comprises a memory device.

EXAMPLE EMBODIMENT 5. The multi-die system of example embodiment 4, wherein separate portions of the memory device are combinable to form a width-adjustable data interface.

EXAMPLE EMBODIMENT 6. The multi-die system of example embodiment 1, wherein the peripheral circuit comprises a transceiver.

EXAMPLE EMBODIMENT 7. The multi-die system of example embodiment 1, wherein the error handling is implemented using Single-bit Error Correction, Double-bit Error Detection (SECDED) code.

EXAMPLE EMBODIMENT 8. The multi-die system of example embodiment 7, wherein the SECDED code comprises Hamming or Hsiao code.

EXAMPLE EMBODIMENT 9. The multi-die system of example embodiment 1, wherein the parity check matrix and the plurality of matrices are block matrices.

EXAMPLE EMBODIMENT 10. The multi-die system of example embodiment 1, wherein the plurality of ECC modules comprises an encoder, a decoder, or combination thereof.

EXAMPLE EMBODIMENT 11. The multi-die system of example embodiment 1, wherein the plurality of ECC modules provides reconfigurability for the parity check matrix in response to one or more changes to the portion of the core circuit, the portion of the one or more peripheral circuits, or combination thereof.

EXAMPLE EMBODIMENT 12. The multi-die system of example embodiment 1, wherein the multi-channel link comprises an advanced interface bus (AIB) link.

EXAMPLE EMBODIMENT 13. A method, comprising:
generating a parity check matrix based on a configuration of a first die of a multi-die package and an Error Correction Code (ECC), wherein the configuration of the first die is reconfigurable, wherein the ECC handles error detection and correction for the multi-die package;
partitioning the parity check matrix into a plurality of matrices;
programming a plurality of ECC modules respectively comprising a plurality of logic circuits corresponding to a respective matrix of the plurality of matrices; and
routing outputs of the plurality of ECC modules to respective channels of a multi-channel link, wherein the multi-channel link transmits a plurality of data bits and a plurality of parity bits between the first die and a second die of the multi-die package, wherein the plurality of ECC modules process respective portions of the plurality of data bits.

EXAMPLE EMBODIMENT 14. The method of example embodiment 13, comprising reconfiguring the parity check matrix.

EXAMPLE EMBODIMENT 15. The method of example embodiment 13, comprising defining a default channel upon configuration or reconfiguration.

EXAMPLE EMBODIMENT 16. The method of example embodiment 13, wherein an ECC module of the plurality of ECC modules that processes data used by a default channel of the multi-channel link processes the plurality of parity bits.

EXAMPLE EMBODIMENT 17. The method of example embodiment 13, wherein programming the plurality of Error Correction Code (ECC) modules comprises disabling one or more logic circuits of the plurality of logic circuits to change between logic 0 and 1.

EXAMPLE EMBODIMENT 18. A non-transitory computer-readable medium comprising computer-executable instructions that, when executed, cause a processor to perform operations comprising:

generating a parity check matrix based on a configuration of a first die of a multi-die package and an error handling scheme, wherein the configuration of the first die is reconfigurable;
partitioning the parity check matrix into a plurality of matrices;
programming a plurality of modules respectively comprising a plurality of logic circuits corresponding to a respective matrix of the plurality of matrices, wherein the plurality of modules are configured to perform error detection and correction based on the error handling scheme;
routing outputs of the plurality of modules to respective channels of a multi-channel link, wherein the multi-channel link is configured to provide intercommunication between the first die and a second die of the multi-die package;
setting one channel of the multi-channel link to be a default channel; and
causing the multi-channel link to transmit a plurality of data bits and a plurality of parity bits between the first die and the second die of the multi-die package, wherein the plurality of modules are configured to process a portion of the plurality of data bits transmitted via the respective channel, wherein a module associated with the default channel is configured to process the plurality of parity bits.

EXAMPLE EMBODIMENT 19. The non-transitory computer-readable medium of example embodiment 18, wherein the instructions cause the processor to perform operations comprising reconfiguring programmable logic circuitry of the first die.

EXAMPLE EMBODIMENT 20. The non-transitory computer-readable medium of example embodiment 19, wherein reconfiguring the programmable logic circuitry of the first die comprises adjusting a width of the multi-channel link.

What is claimed is:

1. A multi-die system, comprising:
a first die comprising a core circuit and a peripheral circuit wherein a portion of the core circuit and a portion of the peripheral circuit are reconfigurable;
a second die; and
a multi-channel link configured to provide an interconnection between the first die and the second die, comprising:
a plurality of channels configured to transmit a plurality of data bits and a plurality of parity bits, wherein a channel of the plurality of channels is a default channel, and wherein the default channel is configured to receive the plurality of parity bits from the plurality of channels; and
a plurality of Error Correction Code (ECC) modules configured to provide error handling for the plurality of channels, wherein the error handling corresponds to a parity check matrix that is reconfigurable, wherein each of the plurality of ECC modules corresponds to a respective matrix of a plurality of matrices derived from partitioning the parity check matrix, wherein each of the plurality of ECC modules coupled to a respective channel of the plurality of channels is configured to processes a portion of the plurality of data bits transmitted via the respective channel, wherein an ECC module of the plurality of ECC modules coupled to the default channel is configured to processes the plurality of parity bits.

2. The multi-die system of claim 1, wherein the core circuit comprises a field-programmable gate array (FPGA).

3. The multi-die system of claim 2, wherein the FPGA and the plurality of ECC modules are programmable to accommodate different widths of the multi-channel link.

4. The multi-die system of claim 1, wherein the peripheral circuit comprises a memory device.

5. The multi-die system of claim 4, wherein separate portions of the memory device are combinable to form a width-adjustable data interface.

6. The multi-die system of claim 1, wherein the peripheral circuit comprises a transceiver.

7. The multi-die system of claim 1, wherein the error handling is implemented using Single-bit Error Correction, Double-bit Error Detection (SECDED) code.

8. The multi-die system of claim 7, wherein the SECDED code comprises Hamming or Hsiao code.

9. The multi-die system of claim 1, wherein the parity check matrix and the plurality of matrices are block matrices.

10. The multi-die system of claim 1, wherein the plurality of ECC modules comprises an encoder, a decoder, or combination thereof.

11. The multi-die system of claim 1, wherein the plurality of ECC modules provides reconfigurability for the parity check matrix in response to one or more changes to the portion of the core circuit, the portion of the one or more peripheral circuits, or combination thereof.

12. The multi-die system of claim 1, wherein the multi-channel link comprises an advanced interface bus (AIB) link.

13. The multi-die system of claim 1, wherein the default channel is configured to receive the plurality of parity bits from the plurality of channels via one or more parity links.

14. A method, comprising:
generating a parity check matrix based on a configuration of a first die of a multi-die package and an Error Correction Code (ECC), wherein the configuration of the first die is reconfigurable, wherein the ECC handles error detection and correction for the multi-die package;
defining a default channel upon the configuration or reconfiguration to receive a plurality of parity bits;
partitioning the parity check matrix into a plurality of matrices;
programming a plurality of ECC modules respectively comprising a plurality of logic circuits corresponding to a respective matrix of the plurality of matrices; and
routing outputs of the plurality of ECC modules to respective channels of a multi-channel link, wherein the multi-channel link transmits a plurality of data bits via the multi-channel link and the plurality of parity bits via the default channel between the first die and a second die of the multi-die package, wherein the plurality of ECC modules process respective portions of the plurality of data bits.

15. The method of claim 14, comprising reconfiguring the parity check matrix.

16. The method of claim 14, wherein an ECC module of the plurality of ECC modules that processes data used by the default channel of the multi-channel link processes the plurality of parity bits.

17. The method of claim 14, wherein programming the plurality of Error Correction Code (ECC) modules comprises disabling one or more logic circuits of the plurality of logic circuits to change between logic 0 and 1.

18. A non-transitory computer-readable medium comprising computer-executable instructions that, when executed, cause a processor to perform operations comprising:
generating a parity check matrix based on a configuration of a first die of a multi-die package and an error handling scheme, wherein the configuration of the first die is reconfigurable;
partitioning the parity check matrix into a plurality of matrices;
programming a plurality of modules respectively comprising a plurality of logic circuits corresponding to a respective matrix of the plurality of matrices, wherein the plurality of modules are configured to perform error detection and correction based on the error handling scheme;
routing outputs of the plurality of modules to respective channels of a multi-channel link, wherein the multi-channel link is configured to provide intercommunication between the first die and a second die of the multi-die package;
setting one channel of the multi-channel link to be a default channel configured to receive a plurality of parity bits; and
causing the multi-channel link to transmit a plurality of data bits via the multi-channel link and the plurality of parity bits via the default channel between the first die and the second die of the multi-die package, wherein the plurality of modules are configured to process a portion of the plurality of data bits transmitted via the respective channel, wherein a module associated with the default channel is configured to process the plurality of parity bits.

19. The non-transitory computer-readable medium of claim 18, wherein the instructions cause the processor to perform operations comprising reconfiguring programmable logic circuitry of the first die.

20. The non-transitory computer-readable medium of claim 19, wherein reconfiguring the programmable logic circuitry of the first die comprises adjusting a width of the multi-channel link.

* * * * *